(12) United States Patent
Oveis Gharan et al.

(10) Patent No.: US 11,126,219 B2
(45) Date of Patent: Sep. 21, 2021

(54) CLOCK PHASE DETECTION USING INTERIOR SPECTRAL COMPONENTS

(71) Applicants: Shahab Oveis Gharan, Nepean (CA); Kim B. Roberts, Ottawa (CA)

(72) Inventors: Shahab Oveis Gharan, Nepean (CA); Kim B. Roberts, Ottawa (CA)

(73) Assignee: CIENA CORPORATION, Hanover, MD (US)

( * ) Notice: Subject to any disclaimer, the term of this patent is extended or adjusted under 35 U.S.C. 154(b) by 172 days.

(21) Appl. No.: 16/599,678

(22) Filed: Oct. 11, 2019

(65) Prior Publication Data

US 2021/0109563 A1 Apr. 15, 2021

(51) Int. Cl.
| | | |
|---|---|---|
| *H04L 27/14* | (2006.01) | |
| *H04L 27/16* | (2006.01) | |
| *G06F 1/12* | (2006.01) | |
| *H03L 7/087* | (2006.01) | |
| *H04L 7/00* | (2006.01) | |

(52) U.S. Cl.
CPC ............ *G06F 1/12* (2013.01); *H03L 7/087* (2013.01); *H04L 7/0087* (2013.01); *H04L 7/0083* (2013.01)

(58) Field of Classification Search
CPC ......... G06F 1/12; H03L 7/087; H04L 7/0087; H04L 7/0083; H04L 27/2662
USPC ..................... 375/326, 373, 371, 260, 344
See application file for complete search history.

(56) References Cited

U.S. PATENT DOCUMENTS

| | | | |
|---|---|---|---|
| 6,363,131 B1 | 3/2002 | Beidas et al. | |
| 6,486,990 B1 | 11/2002 | Roberts et al. | |
| 7,532,822 B2 | 5/2009 | Sun et al. | |
| 7,606,498 B1 | 10/2009 | Wu et al. | |
| 7,627,252 B2 | 12/2009 | Sun et al. | |
| 7,701,842 B2 | 4/2010 | Roberts et al. | |
| 7,792,202 B2* | 9/2010 | Kim | H04L 27/2662 375/260 |
| 8,135,283 B2 | 3/2012 | Sun et al. | |
| 8,463,133 B1 | 6/2013 | Roberts | |

(Continued)

OTHER PUBLICATIONS

Du, et al., "Optimizing the subcarrier granularity of coherent optical communications systems", Optics Express, vol. 19, Issue 9, pp. 8079-8084, Apr. 12, 2011, Apr. 12, 2011.

(Continued)

*Primary Examiner* — Phuong Phu
(74) *Attorney, Agent, or Firm* — Integral Intellectual Property Inc.; Amy Scouten; Miriam Paton

(57) ABSTRACT

A receiver apparatus comprises circuitry configured for storing a first sequence of values. At the receiver apparatus, a communications signal is received which conveys a second sequence of values, the second sequence of values being related to the first sequence of values. According to some examples, the second sequence of values is identical to the first sequence of values. At the receiver apparatus, P results are calculated from a cross-correlation of the first sequence of values with at least a portion of a representation of the communications signal, where P is a positive integer. According to some examples, P≥2. An estimate of a phase offset of a continuous clock is calculated as a function of the P results. According to some examples, the function is a non-linear function. The estimate of the clock phase offset may be used to achieve clock recovery at the receiver apparatus.

18 Claims, 5 Drawing Sheets

(56) References Cited

U.S. PATENT DOCUMENTS

| | | |
|---|---|---|
| 2008/0025424 A1 | 1/2008 | Yang et al. |
| 2012/0177156 A1 | 7/2012 | Hauske et al. |
| 2013/0039665 A1 | 2/2013 | Hauske |
| 2019/0260626 A1 | 8/2019 | Kim et al. |

OTHER PUBLICATIONS

Gardner, "A BPSK/QPSK timing-error detector for sampled receivers", IEEE Trans. Commun. 34, 423-429, 1986.

Godard, "Passband timing recovery in an all-digital modem receiver", IEEE Trans. Commun. 26(5), 517-523, 1978.

Huawei Technologies Co., Ltd., "FlexO-x-DTPC frame consideration", Standards Study Group 15, Geneva Feb. 25-Mar. 1, 2019.

Kim, et al., "A New Joint Algorithm of Symbol Timing Recovery and Sampling Clock Adjustment for OFDM Systems", IEEE Transactions on Consumer Electronics, vol. 44, No. 3, Aug. 1998.

Lee, "A new non-data-aided feedforward symbol timing estimator using two samples per symbol", IEEE Commun. Lett. 6, 205-207, 2002.

Mueller, et al., "Timing recovery in digital synchronous data receivers", IEEE Trans. Commun. 24(5), 516-531, 1976.

Stojanovic, et al., "Digital Phase Detector for Nyquist and Faster than Nyquist Systems", IEEE Communications Letters, vol. 18, No. 3, Mar. 2014.

Hauske et al., "Impact of optical channel distortions to digital timing recovery in digital coherent transmission systems", 12th International Conference on Transparent Optical Networks (ITCON), Jun. 27, 2010, pp. 1-4.

International Search Report and Written Opinion for PCT/IB2020/059170 dated Dec. 16, 2020.

\* cited by examiner

CLOCK PHASE DETECTION USING INTERIOR SPECTRAL COMPONENTS

TECHNICAL FIELD

This document relates to the technical field of optical communications.

BACKGROUND

In an optical communication network, an optical transmitter may transmit an optical signal over a communication channel to an optical receiver, where the signal is representative of digital information in the form of symbols or bits. The receiver may process the signal received over the communication channel to recover estimates of the symbols or bits. Various components of the optical communication network may contribute to signal degradation, such that the signal received at the receiver comprises a degraded version of the signal that was generated at the transmitter. Degradation or distortion may be caused by chromatic dispersion (CD), polarization mode dispersion (PMD), polarization dependent loss (PDL), and amplified spontaneous emission (ASE).

The signal generated at the transmitter may be representative of a stream of symbols to be transmitted at a regular cadence according to times set by a symbol clock, where the frequency of the symbol clock is referred to as the symbol frequency or symbol rate or baud rate. At the receiver, estimates of the symbols may be recovered by sampling the received signal at times set by a sample clock, where the frequency of the sample clock is referred to as the sample frequency or sample rate. The accuracy of the symbol estimates depends on the precise timing of the samples in relation to the timing of the symbols in the received signal. Clock phase noise may result in jitter on the sample times relative to the symbol times, which in turn may reduce accuracy of the symbol estimates. The ability to achieve optimum sample timing at the receiver involves on a process referred to as clock recovery or timing recovery.

SUMMARY

According to a broad aspect, a method is performed at a receiver apparatus, where the method comprises storing a first sequence of values, and receiving a communications signal which conveys a second sequence of values, the second sequence of values being related to the first sequence of values. At the receiver apparatus, a representation of the communications signal is calculated, and P results are calculated from a cross-correlation of the first sequence of values with at least a portion of the representation, wherein P is a positive integer. An estimate of a phase offset of a continuous clock is calculated as a function of the P results. The receiver apparatus comprises circuitry configured for storing the first sequence of values, and a communication interface configured for receiving the communications signal. The circuitry is also configured to implement the calculations performed as part of the method.

According to some examples, the estimate of phase offset is calculated as a function of two or more results, that is, $P \geq 2$.

According to some examples, the function is a non-linear function.

According to some examples, the second sequence of values is identical to the first sequence of values.

According to some examples, each one of the P results is calculated by cross-correlating the first sequence of values with a different portion of a frequency spectrum of the representation.

According to some examples, the estimate of the phase offset is calculated by multiplying one of the P results by the complex conjugate of another one of the P results.

According to some examples, a complex value is calculated based on the P results, and the estimate of the phase offset is calculated from an angle of the complex value.

According to some examples, a complex value is calculated based on the P results, and the estimate of the phase offset is calculated from an imaginary part of the complex value.

According to some examples, calculating the P results comprises applying a frequency-dependent weight to the representation.

According to some examples, the P results are calculated in the frequency domain.

DETAILED DESCRIPTION

Figure 1:
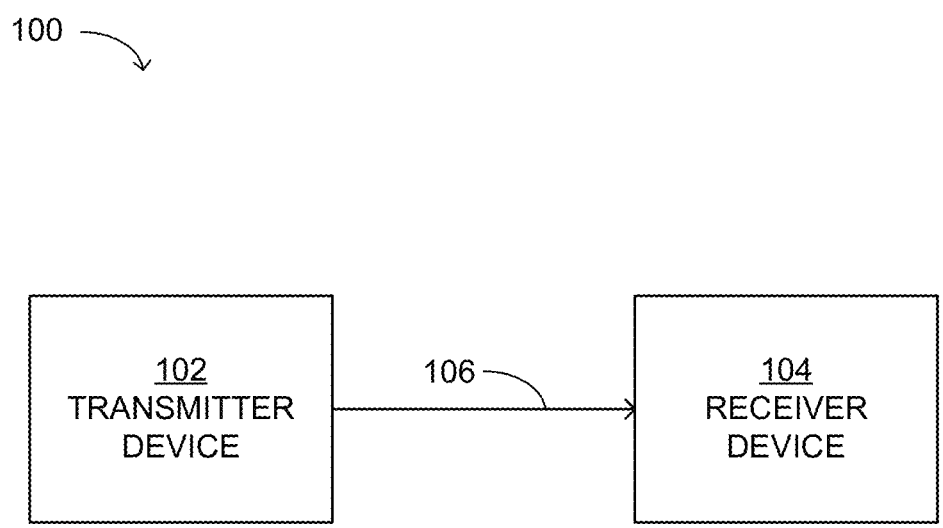
FIG. 1 illustrates an example communication network in accordance with some examples of the technology disclosed herein.

FIG. 1 illustrates an example communication network 100, in accordance with some examples of the technology disclosed herein.

The communication network 100 may comprise at least one transmitter device 102 and at least one receiver device 104, where the transmitter device 102 is capable of transmitting signals over a communication channel, such as a communication channel 106, and where the receiver device 104 is capable of receiving signals over a communication channel, such as the communication channel 106. According to some examples, the transmitter device 102 is also capable of receiving signals. According to some examples, the receiver device 104 is also capable of transmitting signals. Thus, one or both of the transmitter device 102 and the receiver device 104 may be capable of acting as a transceiver. According to one example, the transceiver may comprise a modem.

The communication network 100 may comprise additional elements not illustrated in FIG. 1. For example, the communication network 100 may comprise one or more additional transmitter devices, one or more additional receiver devices, one or more controller devices, and one or more other devices or elements involved in the communication of signals in the communication network 100.

According to some examples, the signals that are transmitted and received in the communication network 100 may comprise any combination of electrical signals, optical signals, and wireless signals. For example, the transmitter device 102 may comprise a first optical transceiver, the receiver device 104 may comprise a second optical transceiver, and the communication channel 106 may comprise an optical communication channel. According to one example, one or both of the first optical transceiver and the second optical transceiver may comprise a coherent modem.

Each optical communication channel in the communication network 100 may include one or more links, where each link may comprise one or more spans, and each span may comprise a length of optical fiber and one or more optical amplifiers.

Where the communication network 100 involves the transmission of optical signals, the communication network 100 may comprise additional optical elements not illustrated in FIG. 1, such as wavelength selective switches, optical multiplexers, optical de-multiplexers, optical filters, and the like. Frequency division multiplexing (FDM) may be used to digitally divide up the modulated optical spectrum into a plurality of subcarriers, each with a different center frequency, such that each subcarrier may be used to transmit a signal that is representative of a different stream of symbols. In this manner, a plurality of symbol streams may be simultaneously communicated, in parallel, over the optical communication channel 106. FDM is possible when the frequencies of the subcarriers are sufficiently separated that the bandwidths of the signals do not significantly overlap. Each different subcarrier corresponds to a different FDM sub-band, also referred to as a FDM channel. The use of Nyquist FDM sub-bands within one optical signal was described by Du et al. in "Optimizing the subcarrier granularity of coherent optical communications systems", *Optics Express*, Vol. 19, No. 9, pp. 8079-8084 (2011). It is also known to use a comb of optical tones that are precisely frequency locked as another way to achieve FDM within one optical signal. Wavelength division multiplexing (WDM) may be used to transmit a plurality of data streams in parallel, over a respectively plurality of carriers, where each carrier is generated by a different laser.

Various elements and effects in the communication network 100 may result in the degradation of signals transmitted between different devices. Thus, a signal received at the receiver device 104 may comprise a degraded version of a signal transmitted by the transmitter device 102. For example, where the communication channel 106 is an optical communication channel, the signal transmitted by the transmitter device 102 may be degraded by optical amplifier noise, optical nonlinearity, polarization-dependent loss or gain (PDL or PDG), polarization mode dispersion (PMD), frequency-dependent loss, and other effects. The degree of signal degradation may be characterized by signal-to-noise ratio (SNR), or alternatively by noise-to-signal ratio (NSR). The signals transmitted in the communication network 100 may be representative of digital information in the form of symbols or bits.

The signal generated at the transmitter device 102 may be representative of a stream of symbols to be transmitted at times set by a transmitter symbol clock, where the frequency of the transmitter symbol clock is set to be, for example, a certain ratio or fraction of a transmitter sampling frequency which may be set by a voltage controlled oscillator (VCO) and associated clocking circuits at the transmitter device 102. The frequency of the symbol clock at the transmitter device 102 may be referred to as the transmitter symbol frequency or symbol rate or baud rate. At the receiver device 104, estimates of the symbols may be recovered by sampling the received signal at times set by a receiver sample clock, where the frequency of the receiver sample clock may be set by a VCO at the receiver device 104. The frequency of the sample clock at the receiver device 104 may be referred to as the receiver sample frequency or sample rate. The receiver sample rate may be selected to satisfy the Nyquist criterion for the highest anticipated transmitter symbol rate. For example, if the transmitter symbol rate is expected to be 10 GBaud, then the receiver sample rate may be set to 20 GHz. U.S. Pat. No. 7,701,842 to Roberts et al. describes using a fractional sample rate that is less than double the symbol rate. A symbol clock at the receiver device 104 may be set to be a certain ratio or fraction of the receiver sample rate and, after initial processing, the information stream may be resampled to a receiver symbol rate that is equal to the transmitter symbol rate. Herein, the term "samples" is generally used to refer to samples taken at the receiver symbol rate, or at some oversampling rate, depending upon the context.

The accuracy of the symbol estimates depends on the precise timing of the samples in relation to the timing of the symbols in the received signal. For example, symbol sample points that are closer to transitions between different signals that are representative of adjacent symbols may provide noisier symbol estimates than symbol sample points that are centered between the transitions. As result of noise in the communication network 100, the relationship between the symbol timing and the sample timing is constantly changing. For example, the VCO at the transmitter device 102 may introduce phase noise and frequency deviations, such that a given symbol in the symbol stream may be transmitted at a time that is offset from the expected time defined by the symbol rate. The VCO at the receiver device 104 may also introduce phase noise and frequency errors, such that a given sample time may be offset from the desired sample time defined by the receiver symbol arrival times. These sources of phase noise, and others introduced in the communication network 100, may result in jitter on the sample times relative to the symbol times, which in turn may reduce the accuracy of the symbol estimates.

Optimum sample timing at a receiver device, such as the receiver device 104, may be achieved using a process known as clock recovery or timing recovery. In general, clock recovery is implemented based on the measurements output by a clock phase detector.

Figure 2:
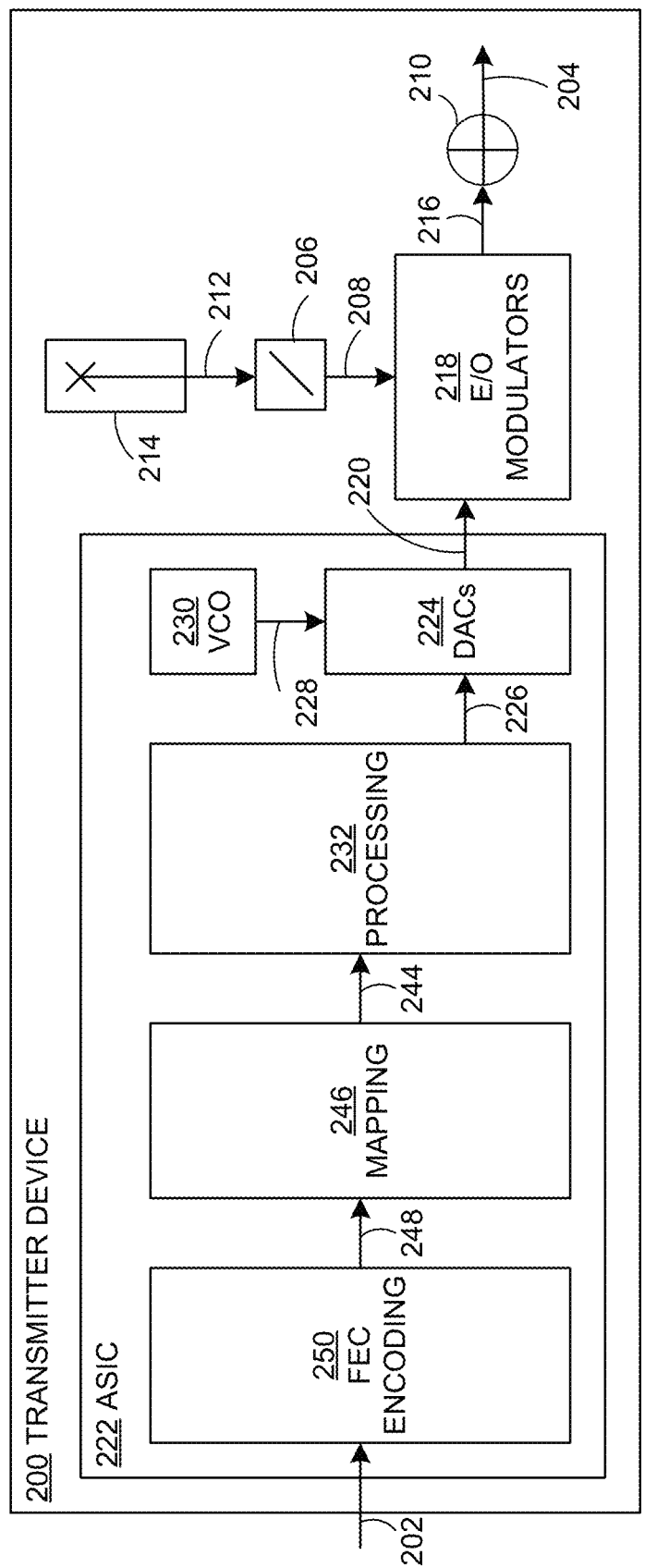
FIG. 2 illustrates an example transmitter device in accordance with some examples of the technology disclosed herein.

FIG. 2 illustrates an example transmitter device 200, in accordance with some examples of the technology disclosed herein. The transmitter device 200 is an example of the transmitter device 102.

The transmitter device 200 is configured to transmit an optical signal 204 which is representative of information bits (also referred to as client bits) 202. According to some examples, the optical transmitter 200 employs polarization-division multiplexing (PDM). In other examples, generation of the optical signal 204 may involve alternative techniques, such as single polarization modulation, modulation of an unpolarized carrier, mode-division multiplexing, spatial-division multiplexing, Stokes-space modulation, polarization balanced modulation, and the like. A laser 214 is configured to generate a continuous wave (CW) optical carrier 212. A polarizing beam splitter 206 is configured to split the CW optical carrier 212 into polarized components 208 that are modulated by electrical-to-optical (E/O) modulators 218 to produce modulated polarized optical signals 216 that are combined by a beam combiner 210, thus yielding the optical signal 204. In some examples (not shown), the locations of the polarizing beam splitter 206 and the beam combiner 210 may be reversed. In some examples (not shown), the polarizing beam splitter 206 and the beam combiner 210 may be replaced with simple power splitters and combiners. Together, elements such as the E/O modulators 218, the laser 214, the beam splitter 206, and the beam combiner 210 may form a communication interface configured to transmit optical signals to other devices in a communication network.

The transmitter device 200 may comprise an application specific integrated circuit (ASIC) 222. According to some examples, the ASIC 222 may be configured to apply FEC encoding 250 to the client bits 202 to generate FEC-encoded bits 248. The FEC-encoded bits 248 may be mapped to one or more streams of data symbols 244 according to a mapping 246. According to some examples, the symbols 244 may comprise a plurality of parallel streams of symbols where each stream corresponds to a different FDM subcarrier.

The ASIC 222 may be configured to apply processing 232 to the one or more streams of symbols 244. The processing 232 may comprise digital up-sampling of the symbols 244. The processing 232 may further comprise operations that are subsequently applied to the sampled waveform, either in the time domain or the frequency domain. Such operations may include pulse shaping, FDM subcarrier multiplexing, chromatic dispersion precompensation, and distortion precompensation. The processing 232 may include the application of one or more filters, which may involve the application of one or more Fast Fourier Transforms (FFTs) and one or more corresponding inverse FFTs (IFFTs).

The processing 232 may further include the insertion of known symbols into the one or more streams of data symbols 244. For example, Huawei Technologies Co., Ltd. "FlexO-x-DTPC frame consideration," Standards Study Group 15, Geneva 25 Feb.-1 Mar. 2019 describes the insertion of training symbols and pilot symbols for training receiver equalization and tracking carrier phase.

Application of the processing 232 to the one or more streams of symbols 244 results in digital drive signals 226, which comprise an electrical representation of the optical spectrum that is to be used in the transmission of the optical signal 204. For example, the digital drive signals 226 may comprise four signals corresponding to the I and Q components of the X polarization and the I and Q components of the Y polarization.

The transmitter device 200 comprises a plurality of digital-to-analog converters (DACs) 224 which may be used to convert the digital drive signals 226 into respective analog drive signals 220. The DACs 224 may be controlled by a signal 228 received from a VCO 230. The analog drive signals 220 are used to drive the E/O modulators 218, which ultimately results in the optical signal 204.

The optical signal 204 is representative of the stream of symbols 244 (and any additional symbols inserted as a result of the processing 232). The symbol rate is dependent on the signal 228 generated by the VCO 230. In practice, imperfections in the operation of the VCO 230 may result in small variations in the symbol phase away from a constant symbol rate. These variations are one source of the jitter to be corrected by clock recovery at a receiver device.

Although illustrated as comprised in the ASIC 222, in an alternate implementation the DACs 224 or portions thereof may be separate from the ASIC 222. The transmitter device 200 may comprise additional components that are not described in this document.

Figure 3:
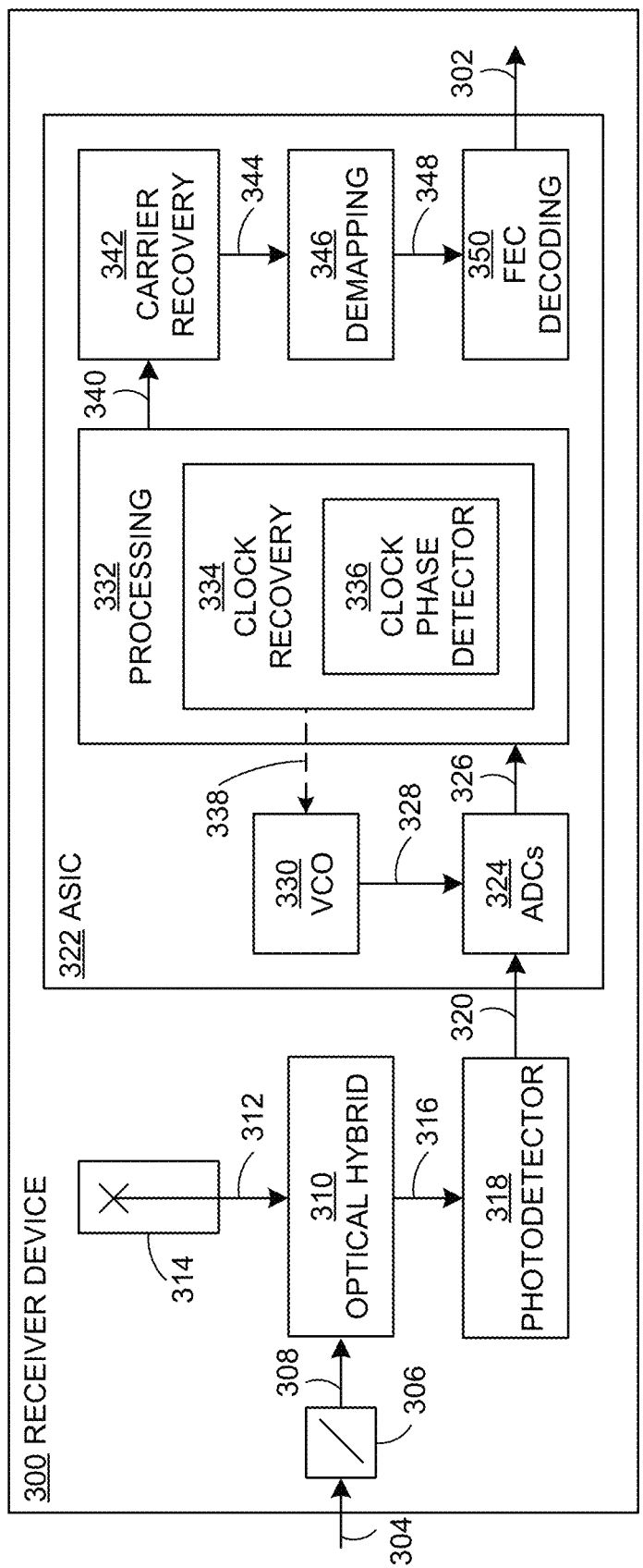
FIG. 3 illustrates an example receiver device in accordance with some examples of the technology disclosed herein.

FIG. 3 illustrates an example receiver device 300, in accordance with some examples of the technology disclosed herein. The receiver device 300 is an example of the receiver device 104.

The receiver device 300 is configured to recover corrected client bits 302 from a received optical signal 304. The received optical signal 304 may comprise a degraded version of an optical signal generated by a transmitter device, such as the transmitter device 102 or 200. A polarizing beam splitter 306 is configured to split the received optical signal 304 into polarized components 308. According to one example, the polarized components 308 may comprise orthogonally polarized components corresponding to an X polarization and a Y polarization. An optical hybrid 310 is configured to process the components 308 with respect to an optical signal 312 produced by a laser 314, thereby resulting in optical signals 316. Photodetectors 318 are configured to convert the optical signals 316 output by the optical hybrid 310 to analog signals 320. According to one example, the analog signals 320 may comprise four signals corresponding, respectively, to the dimensions XI, XQ, YI, YQ, where XI and XQ denote the in-phase and quadrature components of the X polarization, and YI and YQ denote the in-phase and quadrature components of the Y polarization. Together, elements such as the beam splitter 306, the laser 314, the optical hybrid 310 and the photodetector 318 may form a communication interface configured to receive optical signals from other devices in a communication network.

The receiver device 300 may comprise an ASIC 322. The ASIC 322 may comprise analog-to-digital converters (ADCs) 324 which are configured to sample the analog signals 320, and to generate respective digital signals 326. The ADCs 324 sample the analog signals 320 periodically at a sample rate that is based on a signal 328 received from a VCO 330. Similar to the VCO 230 at the transmitter device 200, imperfections in the operation of the VCO 330 at the receiver device 320 may result in small variations in the sample phase away from a constant sample rate. These variations are an additional source of jitter to be corrected by clock recovery.

The ASIC 322 is configured to apply digital processing 332 to the digital signals 326. The processing 332 may comprise the application of one or more filters to the digital signals 326, which may involve the application of one or more FFTs and one or more corresponding IFFTs. The processing 332 may also include down-sampling, FDM subcarrier de-multiplexing, chromatic dispersion post-compensation, and distortion post-compensation.

The processing 332 further comprises clock recovery 334. The clock recovery 334 may be implemented by circuitry which makes use of a clock phase detector 336. The clock phase detector 336 is configured to use the digital signals 326 to generate measurements of phase offset of the sample timing relative to the timing of the symbols represented by the analog signals 320. In general, clock phase offset may be understood to refer to the phase offset of a clock which operates continuously (e.g., for minutes up to years) with respect to a signal stream, where the signal stream may carry on the order of gigabits to terabits per second across large distances (e.g., kilometers). The phase offset measurements output by the clock phase detector 336 may be used to achieve the clock recovery 334 in one or more ways. According to some examples, the clock recovery 334 may be implemented by sending a feedback signal 338 to the VCO 330 based on the phase offset measurements output by the clock phase detector 336. For example, the feedback signal 338 may be generated by applying a low-pass filter to the phase offset measurement output by the clock phase detector 336. The feedback signal 338 may result in slight adjustments of the frequency of the VCO 330, which in turn will cause slight adjustments in the sample timing at the ADCs 324. This feedback technique for clock recovery is commonly known as a phase lock loop (PLL). According to other examples, the clock recovery 334 may be implemented by using the phase offset measurements output by the clock phase detector 336 to generate a phase shift in the signal 328 output by the VCO 330. This mechanism for clock recovery would be implemented using clock phase shifter hardware (not shown) that is known in the art. According to other examples, the clock recovery 334 may be implemented by using the phase offset measurements output by the clock phase detector 336 to generate a phase shift in a downstream version of the digital signals 326. This mechanism for clock recovery would be implemented using data phase shifter hardware (not shown) that is known in the art, either in the time domain or in the frequency domain. The data phase shifter may be applied to a plurality of FDM sub-bands. Both the clock phase shifter and the data phase shifter may rely on a signal generated by applying a finite impulse response (FIR) filter or an infinite impulse response (IIR) filter to the phase offset measurement output by the clock phase detector 336.

Following the processing 332, processed digital signals 340 may undergo carrier recovery 342. Where the optical signal 304 is representative of symbols, the carrier recovery 342 may be used to recover symbol estimates 344, which may in turn undergo symbol-to-bit demapping 346 to recover bit estimates 348. Where the optical signal 304 is representative of symbols comprising FEC-encoded bits generated as a result of applying FEC encoding to client bits, the bit estimates 348 may further undergo FEC decoding 350 to recover the corrected client bits 302.

Although illustrated as comprised in the ASIC 322, in an alternate implementation the ADCs 324 or portions thereof may be separate from the ASIC 322. The receiver device 300 may comprise additional components that are not described in this document.

As previously described, an aim of the clock recovery 334 is to correct jitter caused by transmitter VCO 230 and receiver VCO 330. However, jitter may also arise from numerical noise or electrical noise in the PLL, or from noise or artifacts in the clock phase detector 336. The clock recovery 334 may address all of these sources of jitter for the purpose of achieving the optimum sample timing at the receiver device 300.

The accuracy of the clock phase detector 336 may be reduced by various types of signal distortion or degradation, such as CD, PMD, PDL, and ASE. Optical filtering may also reduce the accuracy of the clock phase detector 336. U.S. Pat. No. 7,627,252 to Sun et al. describes a technique for clock recovery following dispersion compensation. U.S. Pat. No. 7,532,822 to Sun et al. describes a technique for clock recovery following compensation of polarization effects. U.S. Pat. No. 8,135,283 to Sun et al. describes a technique for clock recovery following compensation of inter-symbol interference (ISI) due to polarization effects.

Various methods for clock phase detection are known and may be applied in either the time domain or the frequency domain or some combination thereof. Example methods for clock phase detection are described by Godard in "Passband timing recovery in an all-digital modem receiver," *IEEE Trans. Commun.* 26(5), 517-523, 1978; by Gardner in "A BPSK/QPSK timing-error detector for sampled receivers," *IEEE Trans. Commun.* 34, 423-429, 1986; by Mueller and Muller in "Timing recovery in digital synchronous data receivers," *IEEE Trans. Commun.* 24(5), 516-531, 1976; by Lee in "A new non-data-aided feedforward symbol timing estimator using two samples per symbol," *IEEE Commun. Lett.* 6, 205-207, 2002; and by Stojanovic et al. in "Digital phase detector for Nyquist and faster than Nyquist systems," *IEEE Commun. Lett.* 18(3), 511-514, 2014.

Where the sample rate satisfies the Nyquist criterion, application of a raised cosine filter to the signal in the frequency domain has the desirable effects of achieving zero ISI in the time domain and minimum noise bandwidth. It is common practice to split a raised cosine filter between a transmitter and receiver by applying a root-raised cosine filter at each device, also known as matched filters. For example, the processing 232 applied at the transmitter device 200 may include a first raised-root cosine filter, while the processing 332 applied at the receiver device 300 may include a second raised-root cosine filter. The shape of the raised cosine achieved by the pair of matched filters is characterized by a roll-off factor $\rho$. As the value of the roll-off factor $\rho$ approaches zero, the shape of the raised cosine becomes closer to a rectangle function in the frequency domain.

Figure 4:
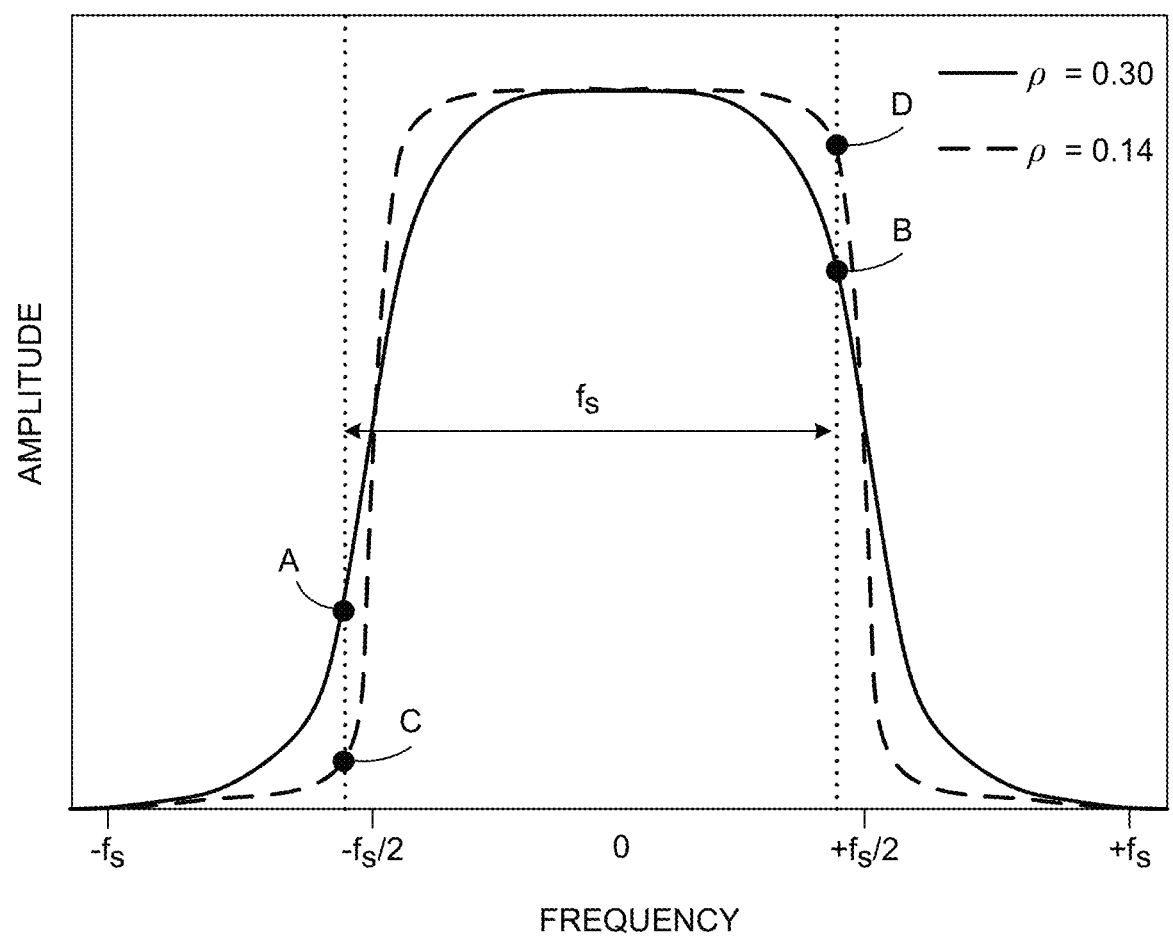
FIG. 4 illustrates example frequency spectra of a received signal filtered using raised cosine filters having different roll-off factors.

FIG. 4 illustrates example frequency spectra of a received signal filtered using raised cosine filters having different roll-off factors, in accordance with some examples of the technology disclosed herein. The range of amplitude values, the range of frequency values, and the values of the roll-off factors are for illustrative purposes only and should not be considered necessarily limiting.

The solid curve represents the frequency spectrum resulting from a raised cosine filter having a roll-off factor $\rho=0.30$, while the dashed curve represents the frequency spectrum resulting from a raised cosine filter having a roll-off factor $\rho=0.14$. The symbol rate is denoted by $f_s$. A comparison of the two curves shows that decreasing the value of the roll-off factor $\rho$ results in sharper roll-off regions and less energy extending beyond $\pm f_s/2$.

The method of clock phase detection described by Godard involves calculations which are performed on frequency components within the roll-off regions of the raised cosine spectrum. According to the Godard method, frequency components in one roll-off region are multiplied by the complex conjugate of frequency components in the other roll-off region and then summed. These counterpart frequency components are separated by the symbol rate $f_s$. An example pair of counterpart frequency components, also referred to as a Godard pair, is denoted by points A and B in FIG. 4. It may be shown that the product of one component and the complex conjugate of another component contains clock phase information. The same operation may be applied to many different Godard pairs over a range of frequencies, and the results may be averaged to obtain an estimate of the clock phase offset.

It may be of interest to use a very small value for the roll-off factor $\rho$ so as to limit the amount of signal excess bandwidth (i.e., bandwidth occupied beyond the symbol rate) as well as minimize the energy in the roll-off regions. Any unused portions of the spectrum beyond $\pm f_s/2$ could be harvested for improved spectral efficiency. For example, sharper roll-off regions could allow for closer proximity between FDM sub-bands, or wavelength divisional multiplexing (WDM) bands, or both. Reducing the amount of energy in the roll-off regions may also avoid problems with optical filters cutting off the Godard band, which would result in clock failure.

When using the Godard method of clock phase detection, the ability to reduce the value of the roll-off factor is limited by the fact that the Godard method is reliant on the signals in the roll-off regions. As the value of the roll-off factor $\rho$ decreases, the products computed from the Godard pairs will become increasingly noisy as the frequency width over which the Godard method is applied decreases. For example, referring to FIG. 4, points C and D denote a Godard pair taken from the frequency spectrum with the roll-off factor $\rho=0.14$. The signal at point C is much lower, and thus expected to be much noisier, than the corresponding signal at point A, taken from the frequency spectrum with the roll-off factor $\rho=0.30$. As the roll-off factor is reduced, clock phase detection using the Godard method may become less reliable, and may eventually result in clock failure.

Alternative methods for clock phase detection that do not require a large signal excess bandwidth and/or a large amount of energy in the roll-off regions are of interest.

The insertion of known symbols or sequences of symbols into client data has been done for a variety of purposes. For example, Huawei Technologies Co., Ltd. "FlexO-x-DTPC frame consideration," Standards Study Group 15, Geneva 25 Feb.-1 Mar. 2019 describes the insertion of training symbols and pilot symbols. In another example, U.S. Pat. No. 7,606,498 to Wu et al. describes using periodic SYNC symbols for carrier recovery. In another example, U.S. Pat. No. 6,486,990 to Roberts describes the introduction of subharmonic patterns into a soliton stream to simplify clock recovery, where the subharmonic tone may be detected at frequencies significantly lower than the symbol rate. In another example, Kim et al. in "A new joint algorithm of symbol timing recovery and sampling clock adjustment for OFDM systems", *IEEE Trans. Commun.* 44(3), 1142-1149 (1998) describe using the phase difference between pairs of pilot tones in OFDM for determining the sampling clock time offset. In another example, an XOR operation may be applied to a pseudo-random scrambler pattern and a sequence of data bits before transmission in order to ensure enough transitions for clock recovery. In another example, 8b/10b encoding may be applied to ensure a minimum number of transitions in each block of bits.

A sequence of symbols is often organized into frames, with F symbols per frame. The value of F is generally on the order of one thousand to one hundred thousand. U.S. Pat. No. 8,463,133 to Roberts describes using a correlation to periodic SYNC patterns to estimate probabilities of locations of such a frame. Finding frame is distinct from finding clock frequency and clock phase. In most systems with continuous streams of symbols, frame cannot be found until after the symbol clock frequency is stably tracked.

This document describes techniques for clock phase detection which use the interior (i.e., in-band) components of the frequency spectrum. It is proposed that a reference vector be defined which comprises a first predefined sequence of values. A receiver device may be operable or configured to store the reference vector, for example, in a control processor or by defining the reference vector in circuitry of the receiver device. A transmitter device may be operable or configured to transmit a communications signal to the receiver device, wherein the communications signal conveys or is representative of a second predefined sequence of values. The second predefined sequence of values may be related to the first predefined sequence of values. According to some examples, they could be partially or substantially correlated. According to some examples, they could be rotated in the available dimensions or scaled. According to some examples, the first sequence of values could have a different sampling rate or phase than the second sequence of values. According to some examples, the second predefined sequence of values may be identical to the first predefined sequence of values. The second predefined sequence of values may be transmitted at a rate which is related to a symbol rate of the communications signal. For example, the rate of the values in the second predefined sequence may be substantially equal to the symbol rate, or may be related to the symbol rate by an integer ratio. The receiver device may be operable or configured to receive the communications signal via a communication interface and to extract a representation of the received communications. The receiver device may further be operable or configured to calculate P results from a cross-correlation of the first sequence of values with at least a portion of the representation, where P is a positive integer. According to some examples, $P \geq 2$. The receiver device may further be operable or configured to calculate an estimate of a clock phase offset as a function of the P results. The function may be a linear function or a non-linear function. Examples of the function are provided in Equations 12, 13, 15, 16, 18, 19, and 20. The estimate of the clock phase offset may be used for clock recovery, for example, as described with respect to FIG. 3.

According to some examples, the values in the first sequence and the second sequence may comprise known values, which may represent or comprise known symbols. For example, the first sequence of values and the second sequence of values may comprise a synchronization (SYNC) pattern. According to some examples, the values may be repeated at a constant interval, or may follow a known pattern such as a pseudo-random pattern that determines location in time-sequence and values. According to some examples, the values may produce a relatively white spectrum.

According to some examples, the communications signal may comprise information-bearing symbols, and the transmitter device may be configured to insert the first sequence of values into the communications signal at time locations where there are no information-bearing symbols. According to some examples, the values in the first sequence may add or multiply or otherwise modify the stream of information-bearing symbols in the communications signal.

Where the communications signal is an optical signal, the receiver device may be configured to extract the representation of the optical signal by converting the optical signal into an electrical analog signal, converting the analog signal into a digital signal by digitally sampling the analog signal at a sample rate, and generating a signal vector based on the digital signal, where the signal vector is the representation of the communications signal. The sample rate may be equal to or greater than the symbol rate.

The examples described herein involve calculations performed in the frequency domain, but similar calculations may be performed in the time domain.

A predefined sequence of symbols may be represented by a respective sequence of signal values $s_i$ defined for respective positions $p_i$, where $i=1 \ldots L$, and L is an integer greater than 1. For example, where $L=4$, the predefined sequence of symbols would be represented by signal values $s_1, s_2, s_3, s_4$ at positions $p_1, p_2, p_3, p_4$, respectively.

In accordance with Equation 1, a time-domain reference vector $r[n]$ may be defined which comprises the signal values $s_i$ corresponding to the predefined sequence of symbols:

$$r[n] := \begin{cases} s_i & \text{if } n == p_i \\ 0 & \text{otherwise} \end{cases} \quad [1]$$

where $n=1 \ldots N$, and where N is an integer greater than L. For example, where $L=4$ and $N=7$, the time-domain reference vector r[n] would be defined as $s_1$, $s_2$, $s_3$, $s_4$, 0, 0, 0. However, typically, N>>L.

According to some examples, a FFT operation may be applied to the time-domain reference vector r[n] to obtain a corresponding frequency-domain reference vector R[n], as provided by Equation 2:

$$R[n]=FFT\{r[n]\} \quad [2]$$

Because n=1 . . . N, the frequency-domain reference vector R[n] consists of N values. In order to satisfy the Nyquist criterion, an up-sampling operation may be applied to the frequency-domain reference vector R[n] to obtain a corresponding up-sampled frequency-domain reference vector $\tilde{R}[f]$, as provided by Equation 3:

$$\tilde{R}[f]:=\text{Up-Sample}(R[n]) \quad [3]$$

where f=1 . . . $N_u$, where $N_u=N(1+\rho)$, and where $\rho$ denotes a root-raised cosine roll-off factor. According to some examples, the up-sampling operation may be implemented by copying a portion of one or both sides of the spectrum to the corresponding other side of the spectrum. According to some examples, the up-sampling ratio may be an integer fraction that is at least 1, and at most 2.

Thus, $\tilde{R}[f]$ provided by Equation 3 represents a reference vector comprising a first predefined sequence of values. This reference vector may be stored at the receiver device. For example, in a flexible implementation, the reference vector may be stored in a control processor and loaded into a register. In a fixed implementation, the reference vector may be defined in circuitry of the receiver device.

In response to receiving a communications signal transmitted by a transmitter device, the receiver device may extract a representation of the communications signal. The receiver device may calculate P results by cross-correlating the first predefined sequence of values with at least a portion of the representation, where P is a positive integer. To understand how these results may be used to estimate a clock phase offset at the receiver device, the anticipated properties of the representation extracted at the receiver device will be derived from the communications signal transmitted by the transmitter device.

As previously noted, the communications signal generated at the transmitter device conveys a second predefined sequence of values which is related to the first predefined sequence of values. As described with respect to FIG. 2, the second predefined sequence of values may be periodically inserted into client data symbols using the processing 232.

For the purposes of the following examples, the communications signal is assumed to be an optical signal. For simplicity, the examples involve a single carrier communications signal conveying a single sequence of values in a single polarization. However, other examples are contemplated wherein the sequence or signal may span various dimensions, polarizations, wavelengths, or carrier frequencies.

The optical signal may comprise K FDM sub-bands, where K≥1. Referring to the digital signals 226 in FIG. 2, the digital signal corresponding to the $k^{th}$ FDM sub-band may be represented in the time domain by a signal vector $x_k[m]$, where m=1 . . . N. Each time-domain signal vector $x_k[m]$ comprises the sequence of signal values $s_i$ corresponding to the predefined sequence of symbols, such that Equation 4 is satisfied:

$$x_k[p_i]=s_i \quad [4]$$

meaning that the value of signal vector $x_k$ at the $i^{th}$ position, $p_i$, is equal to the $i^{th}$ signal value, $s_i$, of the reference vector r[n].

According to some examples, the predefined sequence of known symbols may be periodically inserted into client data symbols, for example, by the processing 232. Each predefined sequence of known symbols may be inserted as a block of consecutive symbols, or alternatively, may be interspersed with the client data symbols. According to some examples, the predefined sequence of known symbols may have an auto-correlation function that is as close as possible to a Dirac delta function.

According to some examples, a FFT operation may be applied to each time-domain signal vector $x_k[m]$ to obtain a corresponding frequency-domain signal vector $X_k[m]$, as provided by Equation 5:

$$X_k[m]=FFT\{x_k[m]\} \quad [5]$$

Because m=1 . . . N, the $k^{th}$ frequency-domain signal vector $X_k[m]$ consists of N values. In order to satisfy the Nyquist criterion, an up-sampling operation may be applied to each frequency-domain signal vector $X_k[m]$ to obtain a corresponding up-sampled frequency-domain signal vector $\tilde{X}_k[r]$, as provided by Equation 6:

$$\tilde{X}_k[r]:=\text{Up-Sample}(X_k[m]) \quad [6]$$

where r=1 . . . $N_u$, where $N_u=N(1+\rho)$, and where $\rho$ denotes the root-raised cosine roll-off factor.

In the event that the number of FDM sub-bands K≥1, it is contemplated that the up-sampled frequency-domain signal vectors $\tilde{X}_k[r]$ may be concatenated to form a single larger up-sampled frequency-domain signal vector $\hat{X}[f]$. This is shown in Equation 7:

$$\hat{X}[f]:=[\tilde{X}_1[r],\tilde{X}_2[r], \ldots ,\tilde{X}_K[r]] \quad [7]$$

where f=1 . . . $KN_u$. In the case that K=1, $\hat{X}[f]$ simplifies to $\tilde{X}_1[r]$.

As described with respect to FIG. 2, the transmitter device may convert the signal vector $\hat{X}[f]$ into an optical signal which may be transmitted to the receiver device.

The receiver device is expected to receive a degraded version of the optical signal that was transmitted by the transmitter device. As described with respect to FIG. 3, the receiver device may recover a received frequency-domain signal vector $\hat{Y}[f]$ which corresponds to the frequency-domain signal vector $\hat{X}[f]$ generated at the transmitter. That is, similar to Equation 7, the received frequency-domain signal vector $\hat{Y}[f]$ may be defined by Equation 8 as follows:

$$\hat{Y}[f]:=[\tilde{Y}_1[r],\tilde{Y}_2[r], \ldots ,\tilde{Y}_K[r]] \quad [8]$$

where f=1 . . . $KN_u$. In the case that K=1, $\hat{Y}[f]$ simplifies to $\tilde{Y}_1[r]$.

According to some examples, the differences between the received signal vector $\hat{Y}[f]$ and the original signal vector $\hat{X}[f]$ may be modeled by assuming a specific frequency-dependent noise distribution, and also by assuming a specific value of clock phase offset for the values in a time-domain vector that corresponds to the frequency-domain vector $\hat{Y}[f]$. With these assumptions, the relationship between received frequency-domain signal vector at the receiver device and the original frequency-domain signal vector at the transmitter device is provided by Equation 9:

$$\hat{Y}[f] = \hat{X}[f]e^{\frac{j2\pi f\tau}{KN_u}} + Z[f] \quad [9]$$

where $\tau$ denotes a clock phase offset measured in unit intervals (UI), and where Z[f] denotes a frequency-dependent channel noise vector, and j is the square root of −1.

As the following examples will demonstrate, the amount of correlation between the reference vector $\tilde{R}[f]$ provided by Equation 3 and the signal vector $\hat{Y}[f]$ provided in Equation 8 may be used to estimate the clock phase offset $\tau$, based on the relationship defined by Equation 9.

Example 1

This example assumes that there are K=4 FDM sub-bands, such that the received frequency-domain signal vector $\hat{Y}[f]$ is defined by Equation 10 as follows:

$$\hat{Y}[f] := [\tilde{Y}_1[r], \tilde{Y}_2[r], \tilde{Y}_3[r], \tilde{Y}_4[r]] \quad [10]$$

where $r=1 \ldots N_u$, and where $f=1 \ldots 4N_u$.

In this example, a separate cross-correlation value is calculated for each of the four FDM sub-bands, where the $k^{th}$ cross-correlation value, $C_k$, is provided by Equation 11:

$$C_k := \Sigma_{f=1}^{N_u} \tilde{Y}_k[f] \tilde{R}^*[f] \quad [11]$$

where $\tilde{R}^*[f]$ denotes the complex conjugate of $\tilde{R}[f]$.

The above calculation will result in four cross-correlation values $C_1$, $C_2$, $C_3$, $C_4$, where $C_1$ is calculated from the FDM sub-band k=1 comprising the lowest frequencies, and where $C_4$ is calculated from the FDM sub-band k=4 comprising the highest frequencies.

The four cross-correlation values $C_1$, $C_2$, $C_3$, $C_4$ obtained from the cross-correlation calculation of Equation 11 may be used to calculate an estimate of the clock phase offset, $\hat{\tau}_1$, according to Equation 12:

$$\hat{\tau}_1 := \frac{2}{\pi} \cdot \text{Angle}\left(\sum_{q=1}^{3} C_{q+1} \cdot C_q^*\right) \quad [12]$$

where Angle( ) denotes the angle of a complex value.

As shown in the proof provided in the Appendix, the clock phase offset $\hat{\tau}_1$ is calculated as a non-linear function of P=4 results, where the results are the four cross-correlation values $C_1$, $C_2$, $C_3$, $C_4$.

Example 2

This example again assumes that there are K=4 FDM sub-bands, such that the received frequency-domain signal vector $\hat{Y}[f]$ is defined by Equation 10. However, instead of calculating a separate cross-correlation value for each of the four FDM sub-bands, Equation 11 is only used to calculate cross-correlation values for the outer FDM sub-bands, thereby resulting in two cross-correlation values, $C_1$ and $C_4$, corresponding to the lowest frequency FDM sub-band and the highest frequency FDM sub-band, respectively.

The two cross-correlation values $C_1$ and $C_4$ obtained from the cross-correlation calculation of Equation 11 may be used to calculate an estimate of the clock phase offset, $\hat{\tau}_2$, according to Equation 13:

$$\hat{\tau}_2 := \frac{2}{3\pi} \cdot \text{Angle}(C_4 \cdot C_1^*) \quad [13]$$

As shown in the proof provided in the Appendix, the clock phase offset $\hat{\tau}_2$ is calculated as a non-linear function of P=2 results, where the results are the two cross-correlation values $C_1$ and $C_4$.

In Examples 1 and 2, each different cross-correlation value is calculated from a signal vector corresponding to a different FDM sub-band. However, other examples are contemplated in which each different cross-correlation value is calculated from a signal vector corresponding to a different portion of a single FDM sub-band. For example, referring to Equation 10, instead of the signal vectors $\tilde{Y}_k[r]$ corresponding to K different FDM sub-bands, they could correspond to K different portions of a single FDM sub-band. For example, a single FDM sub-band could be divided into four quarters, as defined by Equation 14:

$$\hat{Y}[f] := [\tilde{Y}_{NHB}[r], \tilde{Y}_{NLB}[r], \tilde{Y}_{PLB}[r], \tilde{Y}_{PHB}[r]] \quad [14]$$

where $\tilde{Y}_{NHB}[r]$ denotes the negative high-band portion of spectrum, where $\tilde{Y}_{NLB}[r]$ denotes the negative low-band portion of spectrum, where $\tilde{Y}_{PLB}[r]$ denotes the positive low-band portion of spectrum, and where $\tilde{Y}_{PHB}[r]$ denotes the positive high-band portion of spectrum. According to this example, Equation 11 would result in four cross-correlation values $C_{PHB}$, $C_{PLB}$, $C_{NLB}$, $C_{NHB}$. Equations 12 and 13, used in Examples 1 and 2 respectively, may be modified to apply to the cross-correlation values $C_{PHB}$, $C_{PLB}$, $C_{NLB}$, $C_{NHB}$, as shown by Equations 15 and 16, respectively:

$$\hat{\tau}_1 := \frac{2}{\pi} \cdot \text{Angle}(C_{PHB} \cdot C_{PLB}^* + C_{PLB} \cdot C_{NLB}^* + C_{NLB} \cdot C_{NHB}^*) \quad [15]$$

$$\hat{\tau}_2 := \frac{2}{3\pi} \cdot \text{Angle}(C_{PHB} \cdot C_{NHB}^*) \quad [16]$$

In each case, the clock phase offset is estimated as a non-linear function of P cross-correlation results, where P≥2.

Estimates of clock phase offset may be calculated based on cross-correlation values that are weighted by a frequency-dependent weighting, as will be described in the following examples.

Example 3

The relationship provided in Equation 9 may be approximated by replacing the exponent function with the first two terms of a Taylor series, according to Equation 17:

$$\hat{Y}[f] \approx \hat{X}[f](1+j2\pi f\tau) + Z[f] \quad [17]$$

Based on the above approximation, a linear minimum mean square error (MMSE) estimate of the clock phase offset, $\hat{\tau}_3$, may be calculated according to Equation 18:

$$\hat{\tau}_3 := \alpha \cdot \text{Imag}(\Sigma_{f=-2N_u}^{2N_u} \hat{Y}[f] \hat{R}^*[f] f) \quad [18]$$

where Imag( ) denotes the imaginary part of a complex value, and $\alpha$ denotes a constant that is independent from signal, noise, and clock jitter.

The term $\hat{R}^*[f]$ f acts as a template to be applied to the signal vector $\hat{Y}[f]$, where the template is weighted by the frequency f. By using a frequency-dependent weight, it may be possible to achieve lower noise in the phase estimate when the higher frequencies have less noise. In this example, each different value of the frequency f produces a distinct result from the cross-correlation, and the clock phase offset $\hat{\tau}_3$ is calculated as a linear function of these results.

A proof of Equation 18 is provided in the Appendix.

Example 4

The Taylor series expansion provided in Equation 17 may be avoided by using a fourth sinusoidal MMSE estimate of the clock phase offset, $\hat{\tau}_4$, which may be calculated according to Equation 19:

$$\hat{\tau}_4 := \alpha \cdot \mathrm{Imag}(\Sigma_{f=-2N_u}^{2N_u} \hat{Y}[f]\hat{R}^*[f]\sin(2\pi f)) \quad [19]$$

Similar to Equation 18, $\alpha$ denotes a constant that is independent from signal, noise, and clock jitter.

The term $\hat{R}^*[f]\sin(2\pi f)$ acts as a template to be applied to the signal vector $\hat{Y}[f]$, where the template includes the frequency-dependent weighting $\sin(2\pi f)$. In this example, each different value of the frequency f produces a distinct result from the cross-correlation, and the clock phase offset $\hat{\tau}_4$ is calculated as a function of these results.

In the preceding examples, the clock phase offset is calculated as a function of P results, where P≥2. However, other examples are contemplated where the clock phase offset may be calculated as a function of a single cross-correlation result. For example, an estimate of clock phase offset, $\hat{\tau}_5$, may be calculated according to Equation 20:

$$\hat{\tau}_5 := \frac{Q}{2\pi} \cdot \mathrm{Angle}(\hat{Y}[f]\hat{R}^*[f]) \quad [20]$$

where Q denotes an appropriate scaling integer. The estimate of clock phase offset, $\hat{\tau}_5$, may be noisy due to noise and data patterning, and consequently may need to be filtered in the time domain, or in the frequency domain, or via the control loop.

Figure 5:
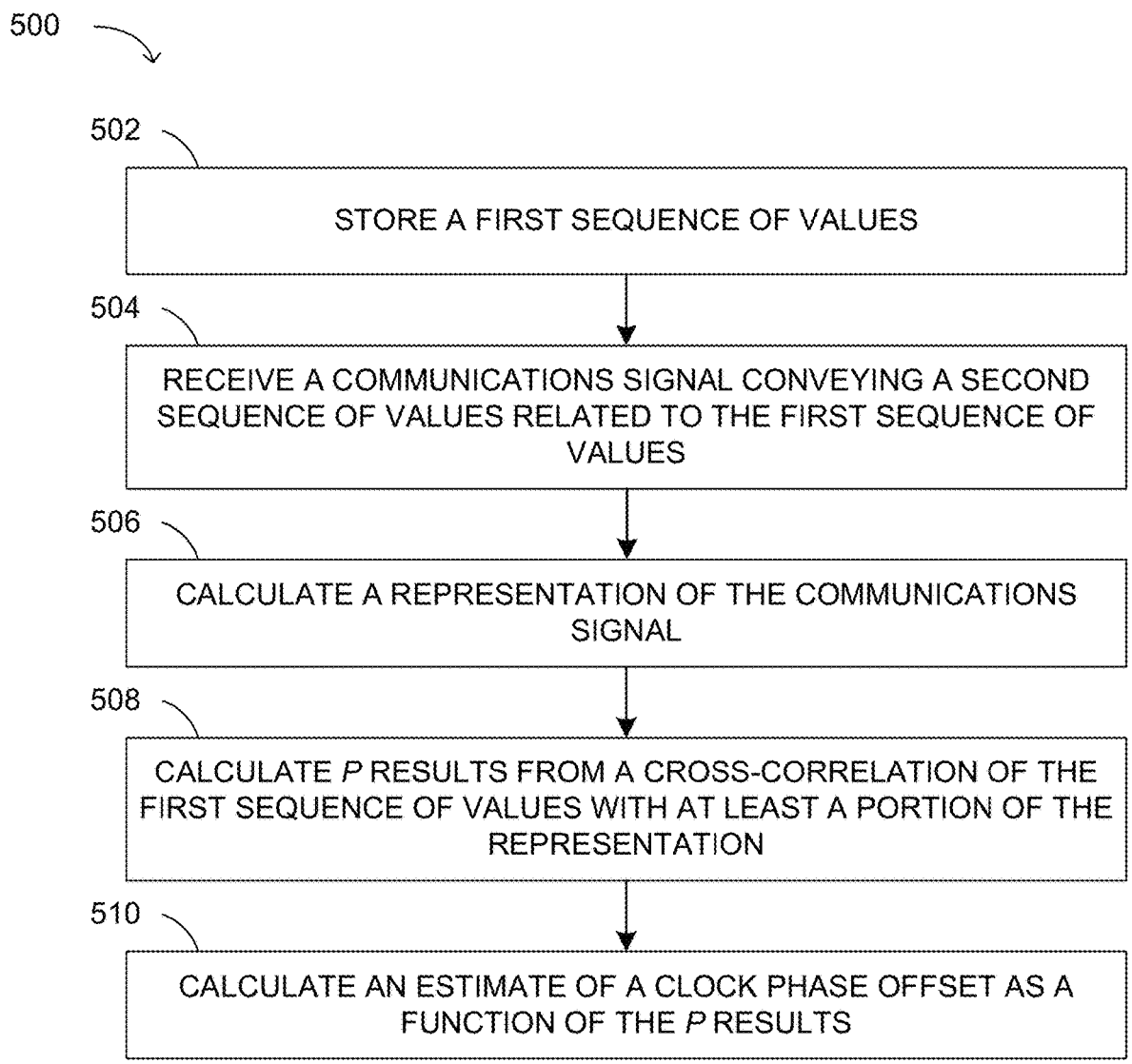
FIG. 5 illustrates an example method for clock phase detection in accordance with some examples of the technology disclosed herein.

FIG. 5 illustrates an example method 500 for clock phase detection in accordance with some examples of the technology disclosed herein. The method 500 may be performed at a receiver device, such as the receiver device 104 or 300.

At 502, a first sequence of values is stored at the receiver device. For example, the frequency-domain reference vector $\tilde{R}[f]$ defined by Equation 3 may be stored in a control processor of the receiver device and loaded into a register, or may be defined by circuitry of the receiver device. According to some examples, the first sequence of values stored at 502 may be defined in the time domain rather than the frequency domain. For example, the time-domain reference vector r[n] defined by Equation 1 may be stored in a memory of the receiver device.

At 504, a communications signal is received at the receiver device. The communications signal comprises a degraded version of a communications signal generated by a transmitter device. For example, the communications signal may comprise a degraded version of the optical signal 204 transmitted by the transmitter device 200, where the optical signal 204 is representative of a stream of symbols transmitted at a symbol rate set by the VCO 230. The communications signal received at 504 conveys a second sequence of values, where the second sequence of values is related to the first sequence of values stored at 502. For example, as described with respect to FIG. 2, the second sequence of symbols may be periodically inserted into the one or more streams of symbols 244 using the processing 232.

At 506, a representation of the communications signal received at 504 is calculated. For example, as described with respect to FIG. 3, the received optical signal 304 may be split into the polarized components 308 by the beam splitter 306, the optical hybrid 310 may process the polarized components 308 with respect to the optical signal 312 produced by the laser 314, and the resulting optical signals 316 output by the optical hybrid 310 may be converted to the analog signals 320. The ADCs 324 may sample the analog signals 320 at the sample rate set by the VCO 330 to generate the respective digital signals 326. The representation may be based on the digital signals 326. Calculation of the representation may include the application of a FFT to the digital signals 326. For example, the representation may comprise the frequency-domain signal vector $\hat{Y}[f]$ defined by any one of Equations 8, 10, and 14. According to other examples, the representation calculated at 506 may comprise a time-domain signal vector, rather than a frequency-domain signal vector. The frequency-domain signal vector $\hat{Y}[f]$ may comprise an up-sampled signal, as the ADC sampling rate is generally higher than the symbol rate in order to accommodate for signal energy present in the Godard band. Downsampling of the frequency-domain signal vector $\hat{Y}[f]$ may performed after estimating clock phase offset, as described with respect to step 510.

At 508, P results are calculated by cross-correlating the first sequence of values stored at 502 with at least a portion of the representation calculated at 506, where P is a positive integer value. According to some examples, P≥2. The cross-correlation may be performed in the frequency domain or the time domain. The cross-correlation may be performed digitally with high-speed hardware, performed more slowly with a processor, or may be implemented as analog circuits such as matched filtering. Full cross-correlation may be performed, or partial cross-correlation may be performed, such as only for certain frequency terms or time locations, or an approximation to a correlation. According to some examples, a plurality of cross-correlation results may be calculated, such as the four cross-correlation results $C_1$, $C_2$, $C_3$, $C_4$ calculated in Example 1, or the two cross-correlation results $C_1$ and $C_4$ calculated in Example 2, where each different cross-correlation result is calculated by cross-correlating the first sequence of values with a different portion of the representation of the communications signal. Each different portion of the representation may comprise a different FDM sub-band, or a different portion of a single FDM sub-band. For example, four cross-correlation results $C_{PHB}$, $C_{PLB}$, $C_{NLB}$, $C_{NHB}$ may be calculated from a positive high-band portion of spectrum, a positive low-band portion of spectrum, a negative low-band portion of spectrum, and a negative high-band portion of spectrum, respectively. The different portions of the spectrum may comprise partially overlapping frequencies or disjoint frequencies. According to other examples, cross-correlation results may be calculated, for example, as described with respect to Examples 3 and 4, by cross-correlating the first sequence of values with the entire representation of the communications signal, together with a frequency-dependent weighting. For example, a plurality of cross-correlation result may be calculated by applying the reference vector $\tilde{R}[f]$ to the entire signal vector $\hat{Y}[f]$ with a weighting f or with a weighting $\sin(2\pi f)$. The P cross-correlation results calculated at 508 may represent the cross-correlation between the first sequence of values and the entire frequency spectrum of the representation, or substantially the entire frequency spectrum of the representation, or only portions of the frequency spectrum of the representation.

At 510, an estimate of a clock phase offset between the symbol rate and the sample rate is calculated as a function of the P cross-correlation results calculated at 508. According to some examples, the function may comprise a non-linear function. According some examples, the non-linear function may comprise a conjugate multiplication operation applied to pairs of spectral results. According to other examples, the non-linear function may comprise other time-domain or frequency-domain non-linear operations on two or more results. According to some examples, an estimate of the clock phase offset may be calculated from the angle of a complex value, where the complex value is based, for example, on four cross-correlation results according to Equation 12 or Equation 15, or based on two cross-correlation results according to Equation 13 or Equation 16. The clock phase offset may be estimated from by applying a function substantially equivalent to a complex-conjugate multiply of a pair of sub-band correlations. According to other examples, an estimate of the clock phase offset may be calculated from the imaginary part of a complex value, where the complex value is based on frequency-weighted cross-correlation results, for example, as provided in Equation 18 or Equation 19. According to other examples, an estimate of the clock phase offset may be calculated as a function of a single cross-correlation value, for example, as provided in Equation 20.

According to some examples, the estimate of the clock phase offset calculated at 510 may have a range of possible values, where the range may substantially span a unit interval (UI), or the time interval occupied by one symbol.

The estimate of the clock phase offset calculated at 510 may be used for clock recovery, as described with respect to FIG. 3. For example, the clock phase offset may be used to adjust the frequency of the VCO 330 as part of a PLL. Alternatively or additionally, the clock phase offset may be used to generate a phase shift in the signal output by the VCO 330. Alternatively or additionally, the clock phase offset may be used to generate a phase shift of a downstream version of the digital signals.

In contrast to previous methods for clock phase detection, such as the Godard method, the methods described herein are not limited by the requirement of significant energy in the roll-off regions. Because the cross-correlation calculations rely on interior spectral components of the signal vector, rather than strictly the roll-off regions, very small values of the roll-off factor ρ may be used. For example, accurate clock phase detection may be achieved even with a roll-off factor is low as ρ=0.01. This substantial reduction in the size of the roll-off regions may allow for improved spectral efficiency. Furthermore, because the sub-bands are much wider than the roll-off regions, the methods described herein are less likely to fail as a result of optical filtering degradations.

In optical transmission systems carrying hundreds of gigabits per second, it may be desirable to have a clock phase detection circuit that does not add significant heat or size to the receiver device, nor add significant delay to the continuous stream of bits being transmitted. This may be achieved, for example, via an ASIC implementation of the frequency-domain version of the methods described herein, where FFT hardware is already required for other signal processing functions. The clock of the digital circuitry implementing the clock phase detection may operate at a small fraction of the symbol rate, such as ⅟₁₂₈ or ³⁄₂₅₆, for example.

The scope of the claims should not be limited by the details set forth in the examples, but should be given the broadest interpretation consistent with the description as a whole.

APPENDIX

Proof for Equation 12
The expected value of $\Sigma_{q=1}^{3} C_{q+1} \cdot C^*_q$ may be derived as follows:

$$E\left\{\sum_{q=1}^{3} C_{q+1} C_q^*\right\} = \sum_{q=1}^{3} E\{C_{q+1} C_q^*\} = \sum_{q=1}^{3} E\{C_{q+1}\} E\{C_q^*\} =$$

$$\sum_{q=1}^{3} \left(\sum_{f=1}^{N_u} E\{\tilde{Y}_{q+1}[f]\tilde{R}^*[f]\}\right) \cdot \left(\sum_{f=1}^{N_u} E\{\tilde{Y}_q^*[f]\tilde{R}[f]\}\right) =$$

$$\sum_{q=1}^{3} \left(\sum_{f=1}^{N_u} E\{|\tilde{R}[f]|^2\} e^{\frac{j2\pi\tau(f+qN_u)}{4N_u}}\right) \cdot$$

$$\left(\sum_{f=1}^{N_u} E\{|\tilde{R}[f]|^2\} e^{-\frac{j2\pi\tau(f+(q-1)N_u)}{4N_u}}\right) = e^{\frac{j2\pi\tau}{4}}$$

$$\sum_{q=1}^{3} \left(\sum_{f=0}^{\frac{N_u}{2}-1} E\{|\tilde{R}[f]|^2\} \cos(2\pi f \tau)\right) \cdot \left(\sum_{f=0}^{\frac{N_u}{2}-1} E\{|\tilde{R}[f]|^2\} \cos(2\pi f \tau)\right)$$

Hence, the angle of the expected value of $\Sigma_{q=1}^{3} C_{q+1} \cdot C^*_q$ is:

$$\text{Angle}\left(E\left\{\sum_{q=1}^{3} C_{q+1} C_q^*\right\}\right) = \frac{\pi}{2}\tau$$

It follows that the estimate of the clock phase offset, $\hat{\tau}_1$, may be expressed as:

$$\hat{\tau}_1 := \frac{2}{\pi} \cdot \text{Angle}\left(\sum_{q=1}^{3} C_{q+1} \cdot C_q^*\right)$$

as per Equation 12
Proof for Equation 13
The expected value of $C_4 \cdot C^*_1$ may be derived as follows:

$$E\{C_4 C_1^*\} = E\{C_4\} E\{C_1^*\} = \left(\sum_{f=1}^{N_u} E\{\tilde{Y}_4[f]\tilde{R}^*[f]\}\right) \cdot \left(\sum_{f=1}^{N_u} E\{\tilde{Y}_1^*[f]\tilde{R}[f]\}\right) =$$

$$\left(\sum_{f=1}^{N_u} E\{|\tilde{R}[f]|^2\} e^{\frac{j2\pi\tau(f+3N_u)}{4N_u}}\right) \cdot \left(\sum_{f=1}^{N_u} E\{|\tilde{R}[f]|^2\} e^{-\frac{j2\pi\tau f}{4N_u}}\right) = e^{\frac{j3\pi\tau}{2}}$$

$$\sum_{q=1}^{3} \left(\sum_{f=1}^{\frac{N_u}{2}-1} E\{|\tilde{R}[f]|^2\} \cos(2\pi f \tau)\right) \cdot \left(\sum_{f=1}^{\frac{N_u}{2}-1} E\{|\tilde{R}[f]|^2\} \cos(2\pi f \tau)\right)$$

Hence, the angle of the expected value of $C_4 \cdot C^*_1$ is:

$$\text{Angle}(E\{C_4 \cdot C_1^*\}) = \frac{3\pi\tau}{2}$$

It follows that the estimate of the clock phase offset, $\hat{\tau}_2$, may be expressed as:

$$\hat{\tau}_2 := \frac{2}{3\pi} \cdot \text{Angle}(C_4 \cdot C_1^*)$$

Proof for Equation 18

Based on the Taylor series approximation of the signal vector $\hat{Y}[f]$ provided by Equation 17, the expected value of $\Sigma_{f=-2N_u}^{2N_u} \hat{Y}[f]\hat{R}^*[f]f$ may be calculated as follows:

$$E\left\{\sum_{f=-2N_u}^{2N_u} \hat{Y}[f]\hat{R}^*[f]f\right\} =$$

$$E\left\{\sum_{f=-2N_u}^{2N_u-1} \left(\hat{X}[f]\left(1 + \frac{j2\pi f\tau}{4N_u}\right) + Z[f]\right)\hat{R}^*[f]f\right\} =$$

$$\sum_{f=-2N_u}^{2N_u-1} E\{\hat{X}[f]\hat{R}^*[f]\}\left(f + j\frac{\pi f^2 \tau}{2N_u}\right) = \sum_{f=-2N_u}^{2N_u-1} E\{|\hat{R}[f]|^2\}\left(f + j\frac{\pi f^2 \tau}{2N_u}\right)$$

Hence, the imaginary part of the expected value of $\Sigma_{f=-2N_u}^{2N_u}\hat{Y}[f]\hat{R}^*[f]f$ is:

$$\text{Imag}\left(E\left\{\sum_{f=-2N_u}^{2N_u} \hat{X}[f]\hat{R}^*[f]f\right\}\right) =$$

$$\sum_{f=-2N_u}^{2N_u-1} E\{|\hat{R}[f]|^2\}\text{Imag}\left(f + j\frac{\pi f^2 \tau}{2N_u}\right) = \frac{\pi\tau}{2N_u}\sum_{f=-2N_u}^{2N_u-1} E\{|\hat{R}[f]|^2\}f^2$$

It follows that the estimate of the clock phase offset, $\hat{\tau}_3$, may be expressed as:

$$\hat{\tau}_3 := \alpha \cdot \text{Imag}\left(\sum_{f=-2N_u}^{2N_u} \hat{Y}[f]\hat{R}^*[f]f\right)$$

Notice that in above, $\alpha$ is a constant (i.e. independent from signal, noise, and clock jitter) which can be calculated as $$\alpha := \frac{2N_u}{\pi \sum_{f=-2N_u}^{2N_u-1} E\{|\hat{R}[f]|^2\}f^2}$$

What is claimed is:

1. A receiver apparatus comprising:
   circuitry configured to store a first sequence of values; and
   a communication interface configured for receiving a communications signal, wherein the communications signal conveys a second sequence of values, the second sequence of values being related to the first sequence of values, and
   wherein the circuitry is configured to
      calculate a representation of the communications signal;
      calculate P results from a cross-correlation of the first sequence of values with at least a portion of the representation, wherein P is a positive integer; and
      calculate an estimate of a phase offset of a continuous clock as a function of the P results, and
   wherein calculating the P results comprises applying a frequency-dependent weight to the representation.

2. The receiver apparatus as claimed in claim 1, wherein $P \geq 2$.

3. The receiver apparatus as claimed in claim 1, wherein the function is a non-linear function.

4. The receiver apparatus as claimed in claim 1, wherein the second sequence of values is identical to the first sequence of values.

5. The receiver apparatus as claimed in claim 2, wherein the circuitry is configured to
   calculate each one of the P results by cross-correlating the first sequence of values with a different portion of a frequency spectrum of the representation.

6. The receiver apparatus as claimed in claim 2, wherein the circuitry is configured to
   calculate the estimate of the phase offset by multiplying one of the P results by the complex conjugate of another one of the P results.

7. The receiver apparatus as claimed in claim 1, wherein the circuitry is configured to
   calculate a complex value based on the P results; and
   calculate the estimate of the phase offset from an angle of the complex value.

8. The receiver apparatus as claimed in claim 1, wherein the circuitry is configured to
   calculate a complex value based on the P results; and
   calculate the estimate of the phase offset from an imaginary part of the complex value.

9. The receiver apparatus as claimed in claim 1, wherein the circuitry is configured to
   calculate the P results in the frequency domain.

10. A method performed at a receiver apparatus, the method comprising:
    storing a first sequence of values;
    receiving a communications signal, wherein the communications signal conveys a second sequence of values, the second sequence of values being related to the first sequence of values;
    calculating a representation of the communications signal;
    calculating P results from a cross-correlation of the first sequence of values with at least a portion of the representation, wherein P is a positive integer; and
    calculating an estimate of a phase offset of a continuous clock as a function of the P results;
    wherein calculating the P results comprises applying a frequency-dependent weight to the representation.

11. The method as claimed in claim 10, wherein $P \geq 2$.

12. The method as claimed in claim 10, wherein the function is a non-linear function.

13. The method as claimed in claim 10, wherein the second sequence of values is identical to the first sequence of values.

14. The method as claimed in claim 11, further comprising
    calculating each result by cross-correlating the first sequence of values with a different portion of a frequency spectrum of the representation.

15. The method as claimed in claim 11, further comprising
    calculating the estimate of the phase offset by multiplying one of the P results by the complex conjugate of another one of the P results.

16. The method as claimed in claim 10, further comprising
    calculating a complex value based on the P results; and
    calculating the estimate of the phase offset from an angle of the complex value.

17. The method as claimed in claim 10, further comprising
    calculating a complex value based on the P results; and
    calculating the estimate of the phase offset from an imaginary part of the complex value.

18. The method as claimed in claim 10, further comprising
    calculating the P results in the frequency domain.

\* \* \* \* \*